United States Patent [19]

Snuffer et al.

[11] 4,273,407

[45] Jun. 16, 1981

[54] COAXIAL CONNECTOR ASSEMBLY FOR ATTACHMENT TO CIRCUIT BOARD

[76] Inventors: Clifton K. Snuffer, 23 Oak St., Walpole, Mass. 02081; Walter T. Cuches, 16 Hillcrest Rd., Medfield, Mass. 02053

[21] Appl. No.: 88,094

[22] Filed: Oct. 24, 1979

[51] Int. Cl.[3] ........................ H01R 17/18; H05K 1/18

[52] U.S. Cl. ............................ 339/177 R; 339/17 LC

[58] Field of Search ............ 339/177 R, 177 E, 17 C, 339/17 LC, 17 R, 14 R

[56] References Cited

U.S. PATENT DOCUMENTS

| | | | |
|---|---|---|---|
| 3,013,227 | 12/1961 | Jordan | 333/31 |
| 3,493,916 | 3/1970 | Hansen | 339/17 |
| 3,539,966 | 11/1970 | Logan | 339/17 |
| 3,553,607 | 1/1971 | Lehrfeld | 333/39 |
| 3,594,687 | 7/1971 | Alderfer | 339/117 RX |
| 3,783,321 | 1/1974 | Patterson | 339/17 LC |
| 3,980,382 | 9/1976 | Reeder | 339/177 R |
| 4,037,913 | 7/1977 | Deitch et al. | 339/182 R X |
| 4,125,308 | 11/1978 | Schilling | 339/17 LC |

FOREIGN PATENT DOCUMENTS

| | | | |
|---|---|---|---|
| 2753874 | 5/1979 | Fed. Rep. of Germany | 339/177 R |

OTHER PUBLICATIONS

Crushed Tubing Coaxial Connector, Schick, IBM Technical Discl. Bulletin, vol. 7, No. 1, Jun. 1964, pp. 91-92.

Light Emitting Diode Mounting Block, Chatlos et al., IBM Technical Discl. Bulletin, vol. 15, No. 1, Jun. 1972, p. 48.

*Primary Examiner*—Eugene F. Desmond
*Attorney, Agent, or Firm*—Wolf, Greenfield & Sacks

[57] ABSTRACT

A coaxial connector assembly for mounting to the edge of a printed circuit board employs a support member having a faceplate and an integral rearwardly extending rib. The rib is provided with rails or dimples that raise the rib to provide a space between the rib and the circuit board enabling cleaning by a solder flux solvent. Coaxial connectors are mounted on the faceplate and extend rearwardly. The center conductors of the coaxial connectors are bent to enable the entire assembly to be secured to a printed circuit board with the center conductors aligned with the conductors on the board to which they are to be attached by solder. The rib is provided with rails or tabs that connect with the ground plane of the circuit board.

4 Claims, 7 Drawing Figures

COAXIAL CONNECTOR ASSEMBLY FOR ATTACHMENT TO CIRCUIT BOARD

FIELD OF THE INVENTION

This invention relates in general to electrical connectors and more particularly pertains to coaxial connector assemblies for use with printed circuit boards.

BACKGROUND OF THE INVENTION

U.S. Pat. No. 3,783,321 which was granted in January 1974 to William Patterson discloses an arrangement in which a coaxial connector makes an electrical connection through the wall of an enclosing box to a printed circuit board. In the Patterson arrangement the coaxial connector protrudes through an aperture in the wall and has its center conductor overlying and soldered to the printed circuitry on the board. The coaxial connector is locked to the wall by a bracket which has tabs that support the printed circuit board and provide a connection to the ground plane of the circuit board. The Patterson arrangement is not convenient where a number of coaxial connectors must be connected to the board nor is that arrangement convenient where quick and easy access to the printed circuit board is desired. Further, the Patterson arrangement is not suited to situations where the printed circuit board must be capable of being easily removed and a replacement put in its place.

SUMMARY OF THE INVENTION

The present invention is directed to an arrangement in which a plurality of coaxial connectors of standard construction are supported on a face plate in a manner enabling the center conductors of the coaxial connectors to be simultaneously wave soldered to the printed circuit board. The faceplate has a protruding rib which overlies the board and provides the ground connection to the board's ground plane. In one embodiment, the faceplate and its integral rib are of conductive material such as aluminum and provide the common ground for the coaxial connectors which are carried by the faceplate. The rib can be secured to the edge of the printed circuit board to provide a stiffening member along the board's edge. When secured to the board, the faceplate and board constitute an integral assembly which can be easily removed and replaced. For easy replacement, the faceplate can be attached to the cabinet by screws or other easily detached fasteners. Further, the faceplate can have indicia on its face to identify the coaxial connectors.

DETAILED DESCRIPTION OF THE INVENTION

Figure 1:
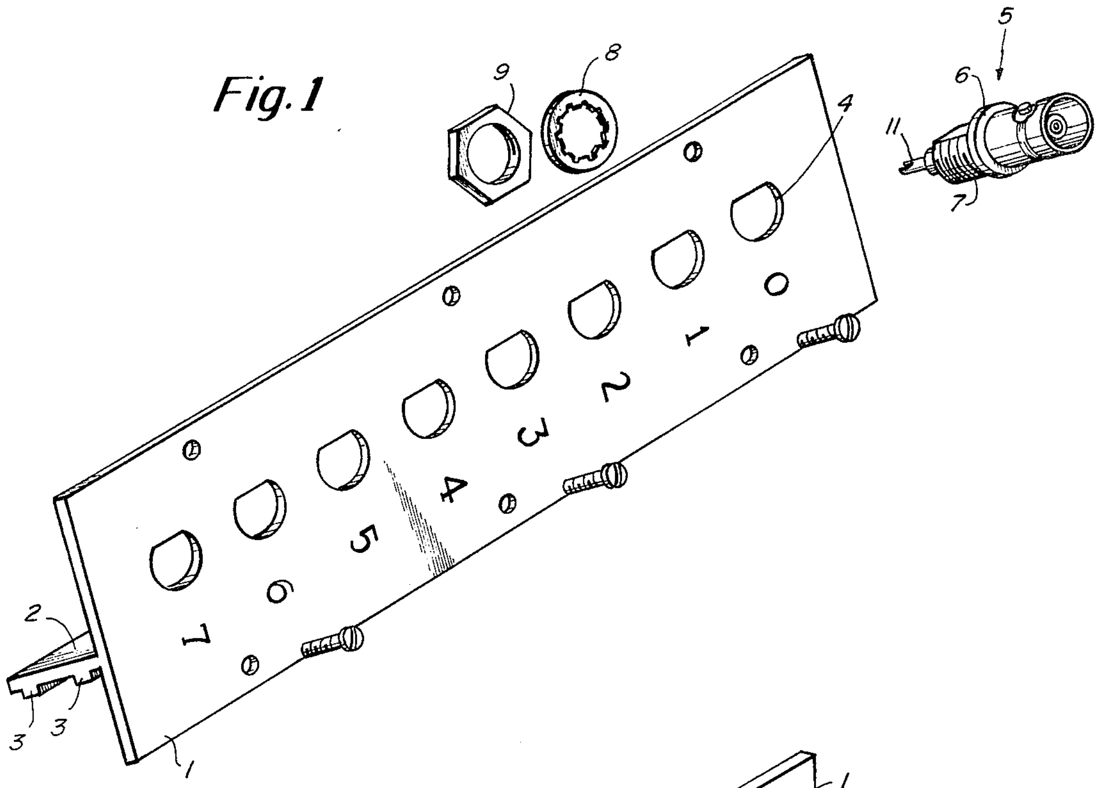
FIG. 1 is a front perspective view of the preferred embodiment of the invention.
Figure 2:
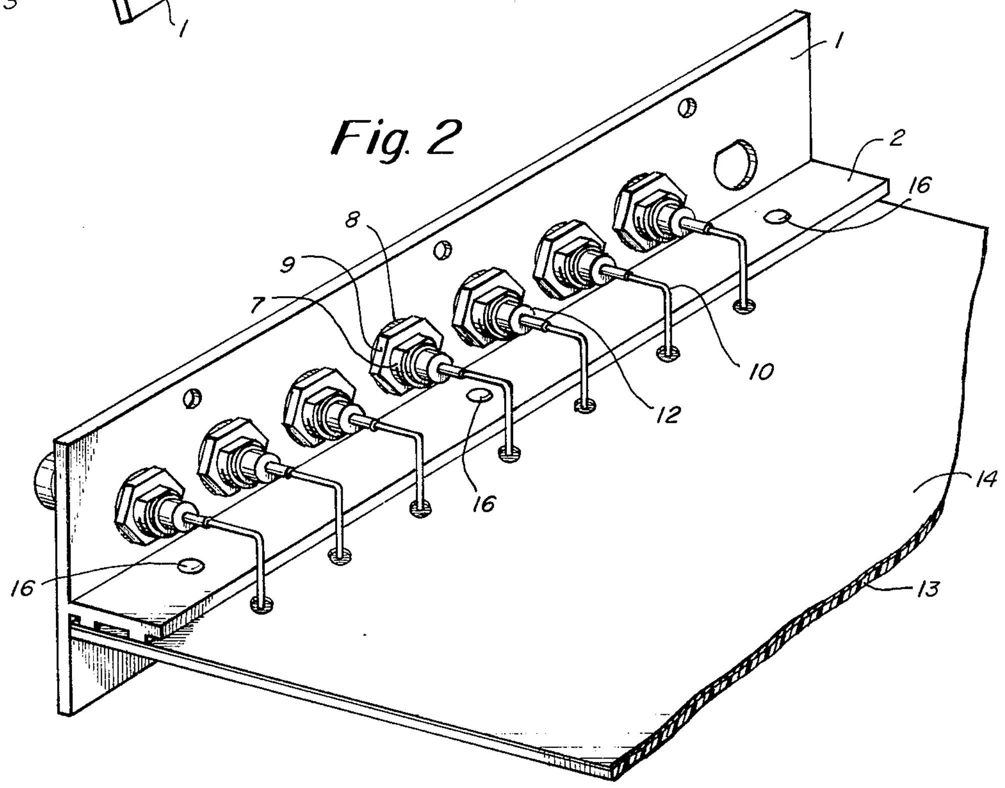
FIG. 2 is a rearward perspective view showing the coaxial connector assembly secured to a printed circuit board.
Figure 3:
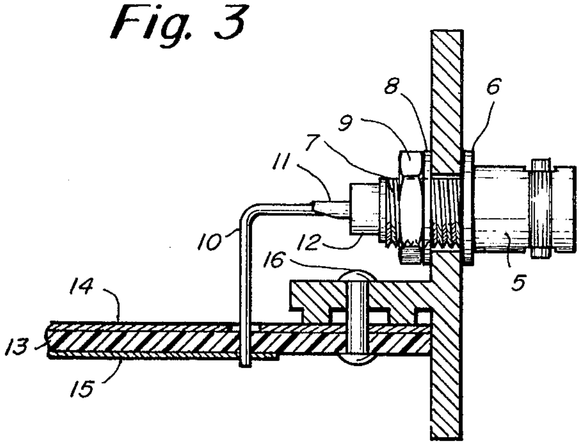
FIG. 3 is a vertical sectional view taken from the right end of FIG. 2.

The preferred embodiment of the invention is depicted in FIGS. 1, 2, and 3 and employs an elongate rectangular faceplate 1 having a rearwardly extending rib 2 carrying a pair of rails 3. Preferably, the faceplate, ribs and rails are integral and are fabricated of extruded aluminum. To accommodate a plurality of coaxial connectors, apertures 4 are provided in the faceplate to receive the coaxial connectors. For purposes of exposition, it is here assumed that the connectors of the assembly shown in FIGS. 1, 2, and 3 are all of the BNC type. Inasmuch as the outer cylindrical shell of the standard BNC coaxial connector is provided with a flat, the aperture in the faceplate for receiving a BNC connector is of the same configuration to accommodate the BNC connector. When inserted in the aperture and secured to the faceplate, the coaxial connector 5 is prevented by the flat surfaces from rotating and, consequently, the orientation of the connector is fixed relative to the faceplate.

The standard BNC connector has a circular front flange 6 which abuts the front of the faceplate. The rearwardly extending outer shell 7 of the connector is threaded and carries a lock washer 8 and a nut 9. Upon tightening the nut the faceplate is pinched between the flange and the nut. The rib 2 is situated in a position where it does not interfere with the coaxial connectors assembled on the faceplate. After the connectors are secured to the faceplate, the center conductor of the coaxial connector is extended by soldering a wire 10 to the nipple 11 which protrudes from the insulator sleeve 12 at the rear of the connector. The wire 9 is cut to the appropriate length before being soldered to the nipple and when attached, that wire extends straight back. After all the center conductor extension wires are attached, those wires are bent 90°. The assembly is then ready to be joined to a printed circuit board 13.

Where the printed circuit board is of the type having the ground plane 14 on one side and the printed circuit conductors 15 on the other side, as depicted in FIG. 3, the rib 2 is positioned over the ground plane so that the rails 3 make contact with the ground plane along their entire length. The rib can be secured to the printed circuit by rivets 16 or other fastening means. The rivet holes in the printed circuit board can act as locators to properly position the assembly so that the center conductors of the coaxial connectors enter holes in the board. The center conductors are then soldered to the printed circuit conductors preferably by wave soldering. Because the flux used in soldering is corrosive, it is customary to clean the board after the soldering operation with a solvent to remove all traces of the flux. The rails 3 raise the rib off the board and enable the solvent to penetrate the space between the rib and the circuit board. Because the rib and rails are of aluminum, a soldered connection is not made between the rails and the ground plane. However, the length of the rails lying upon the ground plane ensures a good ground connection.

The rib extends along the edge of the printed circuit board and because the aluminum rib is more rigid than the board, the rib strengthens the board. Inasmuch as the faceplate, ribs, and rails of the preferred embodiment are of aluminum, the outer conductors of all the coaxial connectors, upon being attached, are grounded to the faceplate. Where, it is not desired to have all the coaxial connectors connected to a common ground, the faceplace can be anodized to form a non-conductive hard coating. The outer shells of the connectors are then insulated from the faceplate by the anodized coating and the individual connectors can then have their outer shells connected to separate grounds. In lieu of using anodized aluminum, the faceplate can be molded, extruded or otherwise formed of an insulative material.

Figure 4:
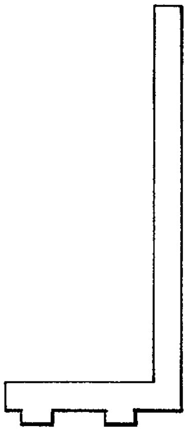
FIG. 4 is a cross-section of an alternative L-shaped form for the support member.
Figure 5:
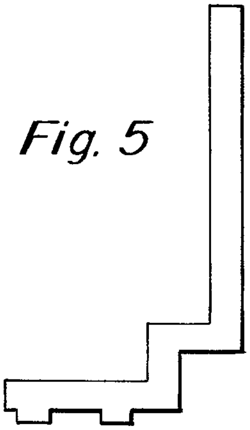
FIG. 5 depicts the cross-section of an alternative form for the support member having a stepped L-shape.

The support member formed by the faceplate, rib, and rails can take forms other than that illustrated in FIGS. 1 and 2. For example, the support member can be L-shaped in cross-section as illustrated in FIG. 4 or the support member can have a step as depicted in the cross-sectional view of FIG. 5.

Figure 6:
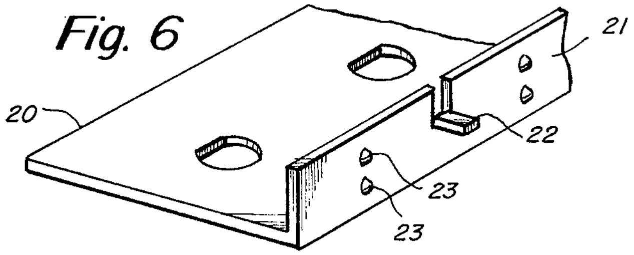
FIG. 6 is a perspective view of an embodiment of the invention having solderable lugs formed out of the rib.
Figure 7:
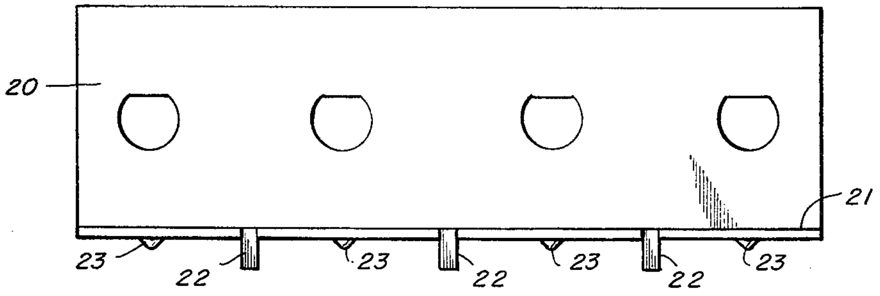
FIG. 7 is a vertical elevational view of the FIG. 6 embodiment.

An alternative embodiment of the support member is depicted in FIGS. 6 and 7. In that alternative embodiment, the faceplate 20 and rib 21 are made of metal sheet from which solderable tabs 22 have been formed. The metal sheet can be brass or copper. However, where low cost is an important factor the metal can be sheet steel which has been plated with tin. The tin plating enables the tabs to be soldered. In lieu of rails, the rib 21 is dimpled at various locations. The dimples 23 act to raise the rib off the surface of the printed circuit board to enable the flux removal solvent to penetrate as previously discussed in connection with the function of the rails. When installed on a printed circuit board, rib 21 is disposed over the border of the board and the lugs 22 enter into and extend through holes in the board. The lugs can then be soldered to the ground plane of the circuit board.

We claim:

1. A coaxial connector assembly for enabling a circuit board disposed behind a faceplate of the assembly to be connected in one wave soldering operation to a plurality of the assembly's coaxial connectors, the assembly comprising (1) a faceplate having apertures therein for receiving at spaced locations coaxial connectors of the type to which a mating coaxial member can be readily attached, (2) a rib attached to and extending rearwardly from the faceplate, (3) a plurality of coaxial connectors disposed at spaced locations in the apertures of the faceplate, each of said plurality of coaxial connectors being of the type having a center conductor disposed within a conductive outer member which has means enabling a mating coaxial member to be attached in a manner permitting easy disconnection, each of said plurality of coaxial connectors being secured to the faceplate and having its center conductor extending rearwardly beyond the rib, and (4) standoff means carried by the rib for spacing the rib from the surface of the aforesaid circuit board.

2. The coaxial connector assembly according to claim 1, further including (5) tabs carried by the rib to provide a means for attachment by soldering.

3. The coaxial connector assembly according to claim 1, wherein the standoff means comprise spaced rails protruding from the rib.

4. The coaxial connector assembly according to claim 1, wherein the standoff means are protruding dimples spaced along the rib.

* * * * *